United States Patent
Lou et al.

(10) Patent No.: US 10,043,752 B2
(45) Date of Patent: Aug. 7, 2018

(54) SUBSTRATE CONTACT USING DUAL SIDED SILICIDATION

(71) Applicant: QUALCOMM Incorporated, San Diego, CA (US)

(72) Inventors: Perry Wyan Lou, Carlsbad, CA (US); Sinan Goktepeli, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 101 days.

(21) Appl. No.: 15/245,087

(22) Filed: Aug. 23, 2016

(65) Prior Publication Data

US 2018/0061760 A1 Mar. 1, 2018

(51) Int. Cl.
| | |
|---|---|
| H01L 23/528 | (2006.01) |
| H01L 21/768 | (2006.01) |
| H01L 21/8234 | (2006.01) |
| H01L 29/45 | (2006.01) |
| H01L 23/66 | (2006.01) |

(52) U.S. Cl.
CPC .... *H01L 23/5283* (2013.01); *H01L 21/76889* (2013.01); *H01L 21/76892* (2013.01); *H01L 21/823475* (2013.01); *H01L 23/66* (2013.01); *H01L 29/456* (2013.01)

(58) Field of Classification Search
CPC ....... H01L 23/48; H01L 23/60; H01L 21/768; H01L 23/481; H01L 29/40; H01L 21/44; H01L 29/417; H01L 23/66; H01L 29/4175; H01L 23/5283; H01L 21/823475; H01L 21/76889; H01L 21/76892; H01L 29/456; H01L 23/528; H01L 21/8234; H01L 29/45
USPC ........ 257/773, 774, 621, 698, 776; 438/667, 438/675
See application file for complete search history.

(56) References Cited

U.S. PATENT DOCUMENTS

| | | | |
|---|---|---|---|
| 7,285,477 | B1 | 10/2007 | Bernstein et al. |
| 7,622,357 | B2 | 11/2009 | Vaed et al. |
| 7,670,927 | B2 | 3/2010 | Bernstein et al. |
| 7,816,231 | B2 | 10/2010 | Dyer et al. |
| 9,093,316 | B2 | 7/2015 | Kuroda |
| 9,755,029 | B1 * | 9/2017 | Goktepeli ............... H01L 23/66 |
| 2008/0206977 | A1 | 8/2008 | Frank et al. |
| 2011/0169084 | A1 | 7/2011 | Yang et al. |
| 2013/0037922 | A1 | 2/2013 | Arriagada et al. |
| 2014/0306291 | A1 | 10/2014 | Alptekin et al. |
| 2015/0137307 | A1 * | 5/2015 | Stuber ..................... H01L 23/60 257/503 |
| 2017/0117206 | A1 * | 4/2017 | Botula ................. H01L 23/3677 |
| 2017/0373445 | A1 * | 12/2017 | Goktepeli .......... H01R 13/6599 |

OTHER PUBLICATIONS

International Search Report and Written Opinion—PCT/US2017/042571—ISA/EPO—Oct. 24, 2017.

* cited by examiner

Primary Examiner — Alexander Oscar Williams
(74) Attorney, Agent, or Firm — Seyfarth Shaw LLP

(57) ABSTRACT

An integrated circuit device may include a front-side contact coupled to a front-side metallization. The integrated circuit device may further include a backside contact coupled to a backside metallization. The front-side contact may be directly coupled to the backside contact.

14 Claims, 11 Drawing Sheets

SUBSTRATE CONTACT USING DUAL SIDED SILICIDATION

TECHNICAL FIELD

The present disclosure generally relates to integrated circuits (ICs). More specifically, the present disclosure relates to for dual sided silicidation contacts.

BACKGROUND

Silicon on insulator (SOI) technology replaces conventional silicon substrates with a layered silicon-insulator-silicon substrate to reduce parasitic device capacitance and improve performance. Silicon on insulator (SOI) based devices differ from conventional silicon-built devices because the silicon junction is above an electrical insulator, typically a buried oxide (BOX) layer. A reduced thickness buried oxide (BOX) layer, however, may not sufficiently reduce the parasitic capacitance caused by the proximity of an active device on the silicon layer and a substrate supporting the buried oxide (BOX) layer.

Conventional complementary metal oxide semiconductor (CMOS) technology begins with a front-end-of-line (FEOL), in which a first set of process steps are performed for fabricating active devices (e.g., negative MOS (NMOS) or positive MOS (PMOS) transistors) on a substrate (e.g., a silicon on insulator (SOI) substrate). A middle-of-line (MOL) is performed next, which is a set of process steps that connect the active devices to the back-end-of-line (BEOL) interconnects (e.g., M1, M2, M3, M4, etc.) using middle-of-line contacts. Unfortunately, parasitic capacitance may result due to a proximity of the back-end-of-line interconnects and/or the middle-of-line contacts to the transistor gates.

In particular, the parasitic capacitance is caused by significant capacitive coupling between the gates and adjacent source/drain middle-of-line contacts as well as capacitive coupling between the gates and adjacent back-end-of-line interconnects. CMOS semiconductor processes also use a substrate contact. A proximity of the substrate contact and adjacent back-end-of-line interconnects cause additional capacitive coupling. This additional capacitance causes adverse effects, such as circuit delays and circuit loses.

SUMMARY

An integrated circuit device may include a front-side contact coupled to a front-side metallization. The integrated circuit device may further include a backside contact coupled to a backside metallization. The front-side contact may be directly coupled to the backside contact.

A method of constructing an integrated circuit may include fabricating a device supported by an isolation layer on a sacrificial substrate. The method may further include depositing a front-side contact layer on the isolation layer. A front-side metallization may be fabricated in a front-side dielectric layer on the device and coupled to the front-side contact layer. A handle substrate may be bonded to the front-side dielectric layer on the device. The sacrificial substrate may be removed. A backside contact layer may be deposited on a semiconductor layer of the device such that the backside contact layer may be in contact with the front-side contact layer. Additionally, a backside metallization may be fabricated in a backside dielectric layer supporting the isolation layer. The backside metallization may be coupled to the backside contact layer distally from the front-side metallization.

An integrated circuit may include a front-side contact coupled to a front-side metallization. The integrated circuit may further include a first means for directly coupling a backside metallization to the front-side contact.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1A:
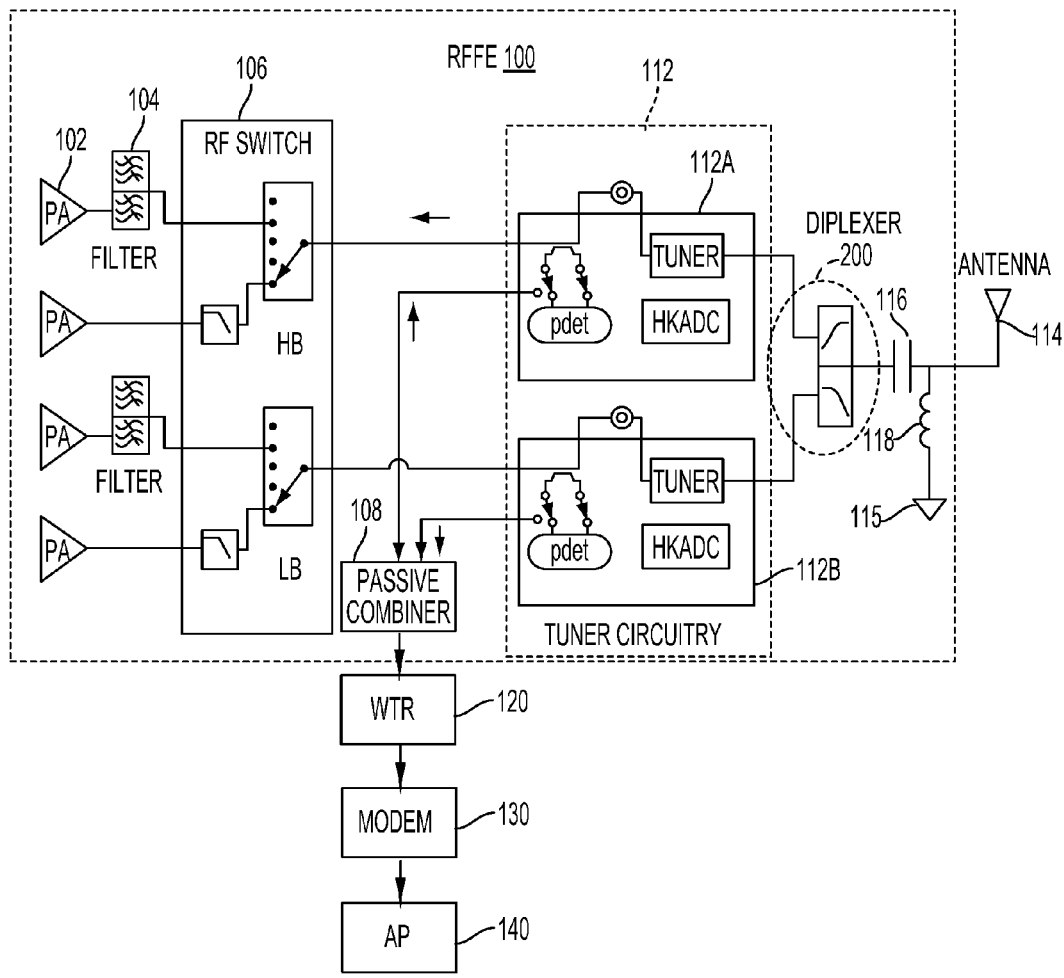
FIG. 1A is a schematic diagram of a radio frequency (RF) front end (RFFE) module employing a diplexer according to an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements, such as carrier aggregation.

The design of these mobile RF transceivers may include the use of silicon on insulator technology. Silicon on insulator (SOI) technology replaces conventional silicon substrates with a layered silicon-insulator-silicon substrate to reduce parasitic device capacitance and improve performance. SOI-based devices differ from conventional, silicon-built devices because the silicon junction is above an electrical isolator, typically a buried oxide (BOX) layer. A reduced thickness BOX layer, however, may not sufficiently reduce the parasitic capacitance caused by the proximity of a device on the silicon layer and a substrate supporting the BOX layer.

Conventional complementary metal oxide semiconductor (CMOS) technology begins with a front-end-of-line (FEOL), in which a first set of process steps are performed for fabricating active devices (e.g., negative MOS (NMOS) or positive MOS (PMOS) transistors) on a substrate (e.g., a silicon on insulator (SOI) substrate). A middle-of-line (MOL) is performed next, which is a set of process steps that connect the active devices to the back-end-of-line (BEOL) interconnects (e.g., M1, M2, M3, M4, etc.) using middle-of-line contacts. Unfortunately, parasitic capacitance may result due to a proximity of the back-end-of-line interconnects and/or the middle-of-line contacts to the transistor gates.

The front-end-of-line processes may include the set of process steps that form the active devices (e.g., transistors). The front-end-of-line processes include ion implantation, anneals, oxidation, chemical vapor deposition (CVD) or atomic layer deposition (ALD), etching, chemical mechanical polishing (CMP), epitaxy. The middle-of-line processes may include the set of process steps that enable connection of the transistors to BEOL interconnects. These steps include silicidation and contact formation as well as stress introduction. The back-end-of-line processes may include the set of process steps that form the interconnects that tie the independent transistors and form circuits. Currently, copper and aluminum are materials to form the interconnects, but with further development of the technology, other conductive material may be used.

In particular, the parasitic capacitance is caused by significant capacitive coupling between the gates and adjacent source/drain middle-of-line contacts as well as capacitive coupling between the gates and adjacent back-end-of-line interconnects. CMOS semiconductor processes also use a substrate contact. A proximity of the substrate contact and adjacent back-end-of-line interconnects causes additional capacitive coupling. This additional capacitance causes adverse effects, such as circuit delays and circuit loses.

A layer transfer process may be used to reduce the additional capacitance by removing some of the routing from a front-side to a backside of the device. Forming contacts from the front-side to the backside, however, can be difficult due to alignment issues between the front-side contacts and the backside contacts. Accordingly, there is a need for forming contacts between the front-side to the backside of a device that overcomes these limitations.

Aspects of the disclosure are directed to using a dual sided silicidation contact that merges silicide on both sides of a substrate to form a low resistance contact instead of going through the substrate (e.g., silicon). For example, a front-side contact (e.g., front-side silicide) can be coupled to a first-side metallization and a backside contact (e.g., backside silicide) can be coupled to a backside metallization. The front-side contact is directly coupled to the backside contact.

Various other aspects of the disclosure provide techniques for backside silicidation for forming dual side contacted capacitors in integrated RF circuit structures. The process flow for semiconductor fabrication of the integrated RF circuit structure may include the noted front-end-of-line processes, the middle-of-line processes, and the back-end-of-line processes. Advantages include simplification in the fabrication process for backside contacts that saves at least one photo and etch step, which also saves costs. Moreover, both sides of the metal and contact align with each other to reduce the metal width. That is, silicide occupies a larger area than metal, enabling reducing of the metal width. Another advantage is that a single contact from one side can couple to multiple contacts on the other side. Additionally, these process simplifications further enhance yields.

It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably unless such interchanging would tax credulity.

FIG. 1A is a schematic diagram of a radio frequency (RF) front end (RFFE) module 100 employing a dual sided silicidation contact according to an aspect of the present disclosure. The RF front end module 100 includes power amplifiers 102, duplexer/filters 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection or other like parameters. In addition, the RF switch module 106 may select certain portions of the input signals to pass on to the rest of the RF front end module 100.

The RF front end module 100 also includes tuner circuitry 112 (e.g., first tuner circuitry 112A and second tuner circuitry 112B), the diplexer 200, a capacitor 116, an inductor 118, a ground terminal 115 and an antenna 114. The tuner circuitry 112 (e.g., the first tuner circuitry 112A and the second tuner circuitry 112B) includes components such as a tuner, a portable data entry terminal (PDET), and a house keeping analog to digital converter (HKADC). The tuner circuitry 112 may perform impedance tuning (e.g., a voltage standing wave ratio (VSWR) optimization) for the antenna 114. The RF front end module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1A, a diplexer 200 is between the tuner component of the tuner circuitry 112 and the capacitor 116, the inductor 118, and the antenna 114. The diplexer 200 may be placed between the antenna 114 and the tuner circuitry 112 to provide high system performance from the RF front end module 100 to a chipset including the wireless transceiver 120, the modem 130 and the application processor 140. The diplexer 200 also performs frequency domain multiplexing on both high band frequencies and low band frequencies. After the diplexer 200 performs its frequency multiplexing functions on the input signals, the output of the diplexer 200 is fed to an optional LC (inductor/capacitor) network including the capacitor 116 and the inductor 118. The LC network may provide extra impedance matching components for the antenna 114, when desired. Then a signal with the particular frequency is transmitted or received by the antenna 114. Although a single capacitor and inductor are shown, multiple components are also contemplated.

Figure 1B:
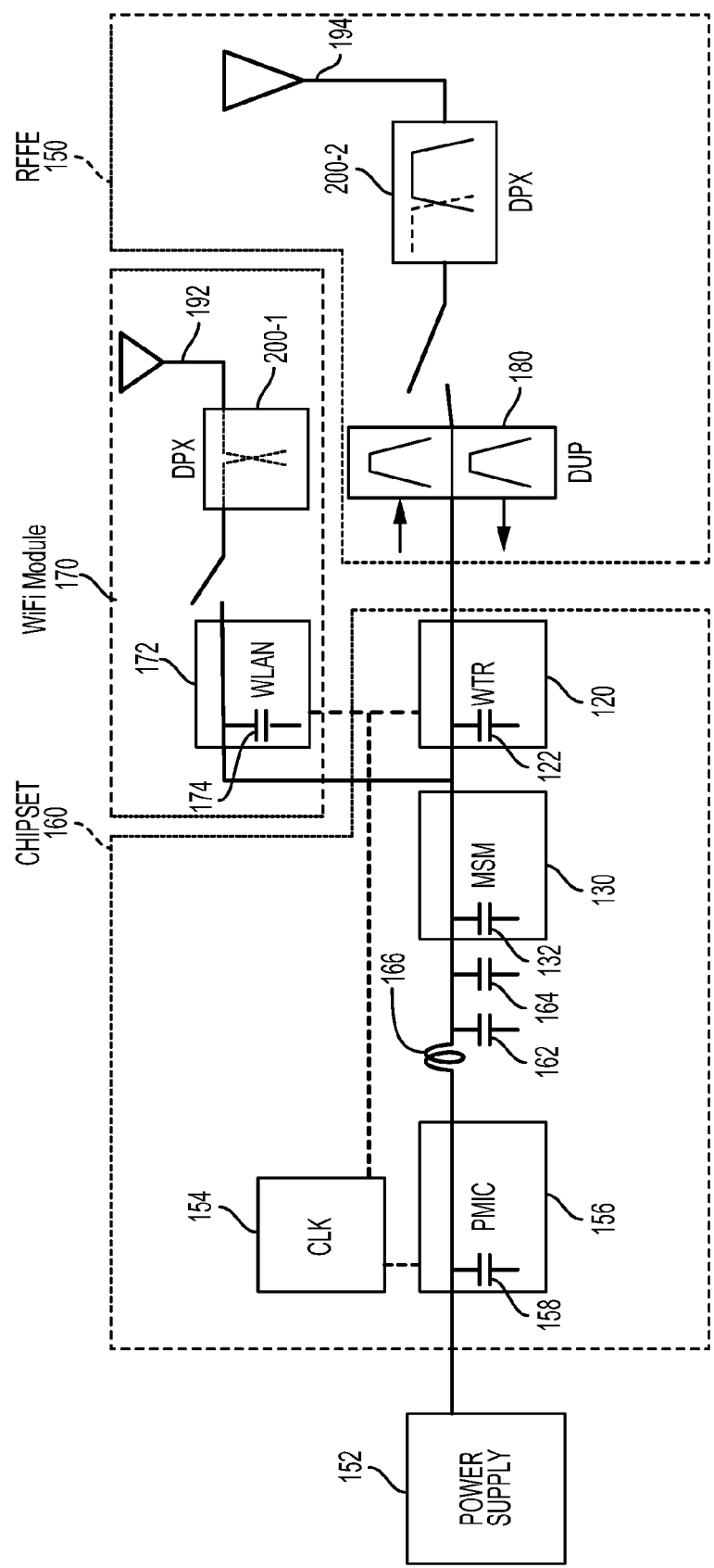
FIG. 1B is a schematic diagram of a radio frequency (RF) front end (RFFE) module employing diplexers for a chipset to provide carrier aggregation according to aspects of the present disclosure.

FIG. 1B is a schematic diagram of a wireless local area network (WLAN) (e.g., WiFi) module 170 including a first diplexer 200-1 and an RF front end module 150 including a second diplexer 200-2 for a chipset 160 to provide carrier aggregation according to an aspect of the present disclosure. The WiFi module 170 includes the first diplexer 200-1 communicably coupling an antenna 192 to a wireless local area network module (e.g., WLAN module 172). The RF front end module 150 includes the second diplexer 200-2 communicably coupling an antenna 194 to the wireless transceiver (WTR) 120 through a duplexer 180. The wireless transceiver 120 and the WLAN module 172 of the WiFi module 170 are coupled to a modem (MSM, e.g., baseband modem) 130 that is powered by a power supply 152 through a power management integrated circuit (PMIC) 156. The chipset 160 also includes capacitors 162 and 164, as well as an inductor(s) 166 to provide signal integrity. The PMIC 156, the modem 130, the wireless transceiver 120, and the WLAN module 172 each include capacitors (e.g., 158, 132, 122, and 174) and operate according to a clock 154. The geometry and arrangement of the various inductor and capacitor components in the chipset 160 may reduce the electromagnetic coupling between the components.

Figure 2A:
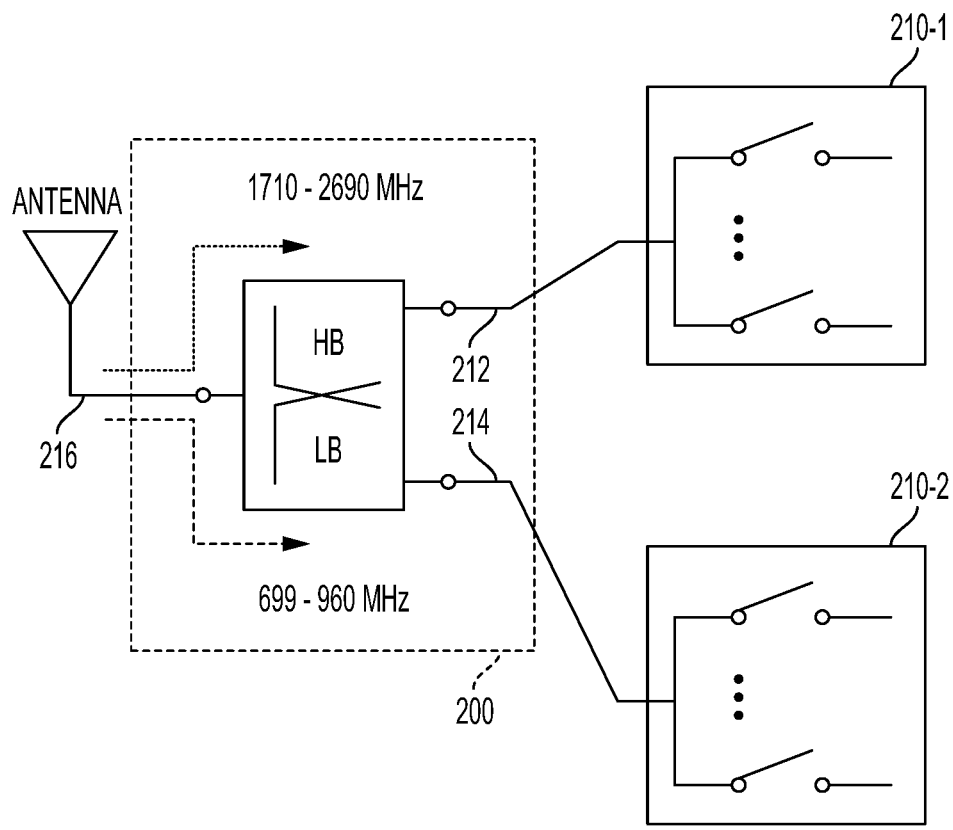
FIG. 2A is a diagram of a diplexer design according to an aspect of the present disclosure.

FIG. 2A is a diagram of a diplexer 200 according to an aspect of the present disclosure. The diplexer 200 includes a high band (HB) input port 212, a low band (LB) input port 214, and an antenna 216. A high band path of the diplexer 200 includes a high band antenna switch 210-1. A low band path of the diplexer 200 includes a low band antenna switch 210-2. A wireless device including an RF front end module may use the antenna switches 210 and the diplexer 200 to enable a wide range band for an RF input and an RF output of the wireless device. In addition, the antenna 216 may be a multiple input, multiple output (MIMO) antenna. Multiple input, multiple output antennas will be widely used for the RF front end of wireless devices to support features such as carrier aggregation.

Figure 2B:
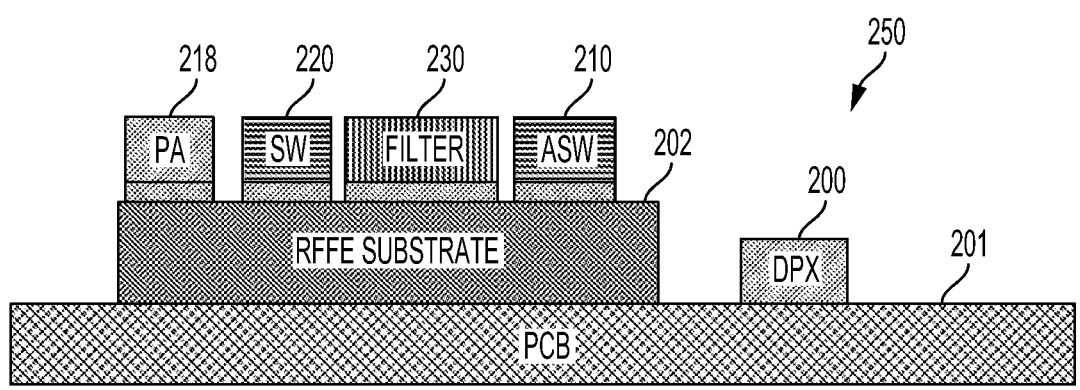
FIG. 2B is a diagram of a radio frequency (RF) front end module according to an aspect of the present disclosure.

FIG. 2B is a diagram of an RF front end module 250 according to an aspect of the present disclosure. The RF front end module 250 includes the antenna switch (ASW) 210 and diplexer 200 (or triplexer) to enable the wide range band noted in FIG. 2A. In addition, the RF front end module 250 includes filters 230, an RF switch 220 and power amplifiers 218 supported by a substrate 202. The filters 230 may include various LC filters, having inductors (L) and capacitors (C) arranged along the substrate 202 for forming a diplexer, a triplexer, low pass filters, balun filters, and/or notch filters to prevent high order harmonics in the RF front end module 250. The diplexer 200 may be implemented as a surface mount device (SMD) on a system board 201 (e.g., printed circuit board (PCB) or package substrate). Alternatively, the diplexer 200 may be implemented on the substrate 202.

In this configuration, the RF front end module 250 is implemented using silicon on insulator (SOI) technology, which helps reduce high order harmonics in the RF front end module 250. Aspects of the present disclosure include a layer transfer process to separate the active device from the substrate, as shown in FIGS. 3A to 3E.

Figure 3A:
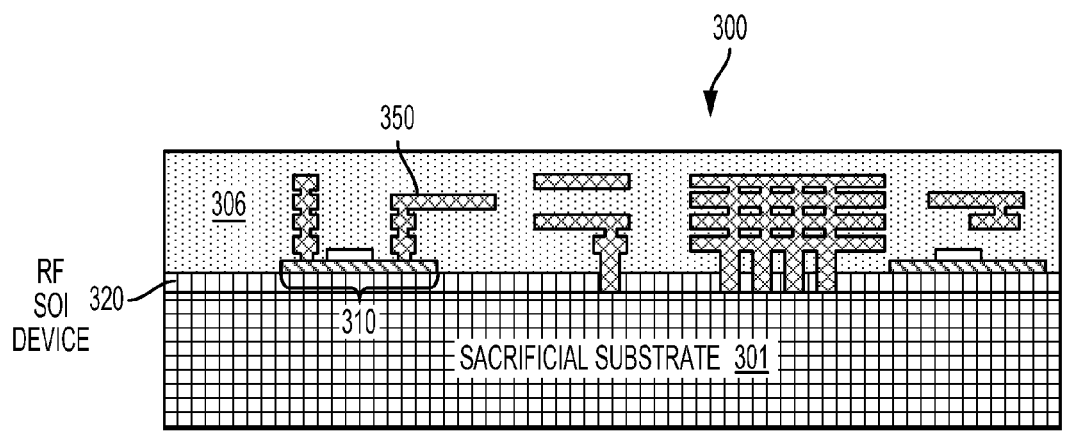
FIGS. 3A to 3E show cross-sectional views of an integrated radio frequency (RF) circuit structure during a layer transfer process according to aspects of the present disclosure.
Figure 3B:
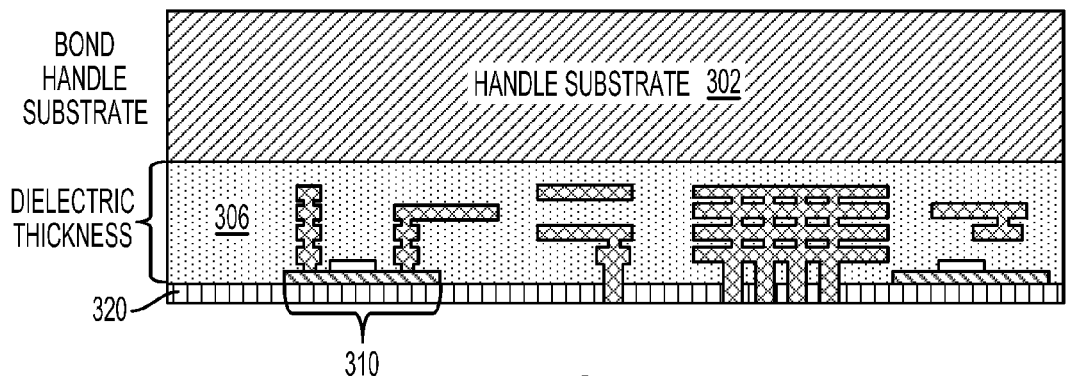

FIGS. 3A to 3E show cross-sectional views of an integrated radio frequency (RF) circuit structure 300 during a layer transfer process according to aspects of the present disclosure. As shown in FIG. 3A, an RF silicon on insulator (SOI) device includes an active device 310 on a buried oxide (BOX) layer 320 supported by a sacrificial substrate 301 (e.g., a bulk wafer). The RF SOI device also includes interconnects 350 coupled to the active device 310 within a front-side dielectric layer 306. As shown in FIG. 3B, a handle substrate 302 is bonded to the front-side dielectric layer 306 of the RF SOI device. In addition, the sacrificial substrate 301 is removed. Removal of the sacrificial substrate 301 using the layer transfer process enables high-performance, low-parasitic RF devices by increasing the dielectric thickness. That is, a parasitic capacitance of the RF SOI device is inversely proportional to the dielectric thickness, which determines the distance between the active device 310 and the handle substrate 302.

Figure 3C:
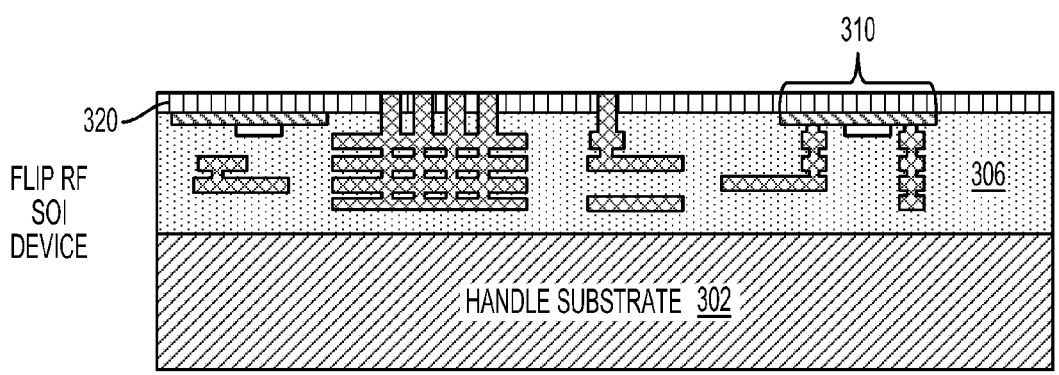
Figure 3D:
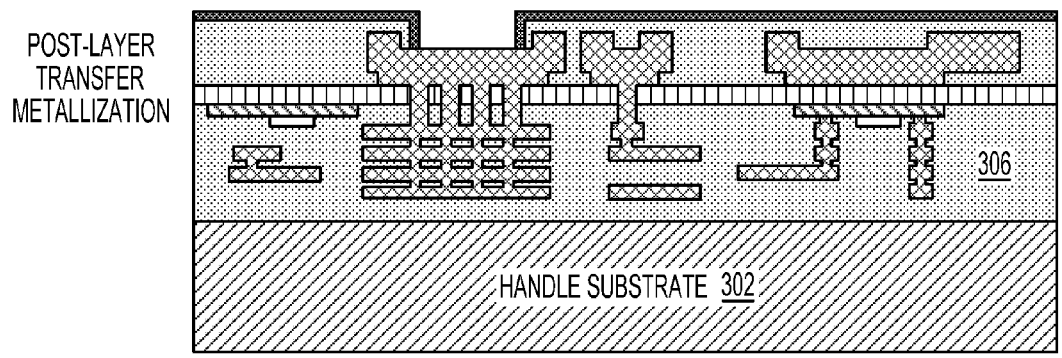
Figure 3E:
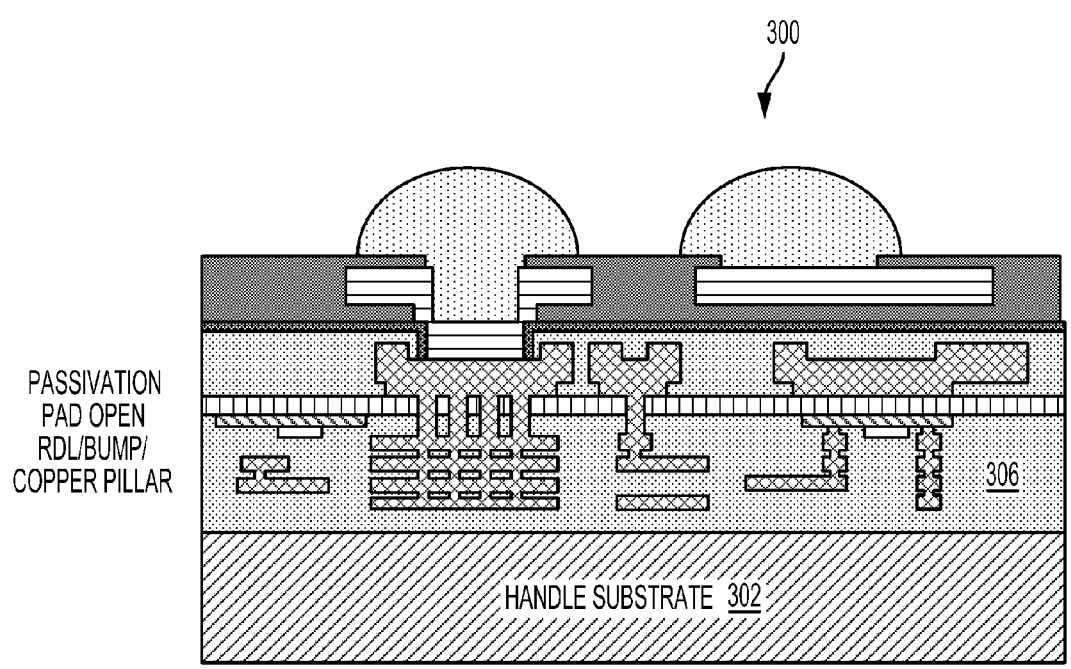

As shown in FIG. 3C, the RF SOI device is flipped once the handle substrate 302 is secured and the sacrificial substrate 301 are removed. As shown in FIG. 3D, a post layer transfer metallization process is performed using, for example, a regular complementary metal oxide semiconductor (CMOS) process. As shown in FIG. 3E, an integrated RF circuit structure 300 is completed by depositing a passivation layer, opening bond pads, depositing a redistribution layer, and forming conductive bumps/pillars to enable bonding of the integrated RF circuit structure 300 to a system board (e.g., a printed circuit board (PCB)).

Referring again to FIG. 3A, the RF SOI device may include a trap rich layer between the sacrificial substrate 301 and the BOX layer 320. In addition, the sacrificial substrate 301 may be replaced with the handle substrate, and a thickness of the BOX layer 320 may be increased to improve harmonics. Although this arrangement of the RF SOI device may provide improved harmonics relative to a pure silicon or SOI implementation, the RF SOI device is limited by the non-linear responses from the handle substrate, especially when a silicon handle substrate is used. That is, in FIG. 3A, the increased thickness of the BOX layer 320 does not provide sufficient distance between the active device 310 and the sacrificial substrate 301 relative to the configurations shown in FIGS. 3B to 3E. Moreover, the RF SOI device is generally limited to CMOS transistor formation on one side of the SOI layer.

Figure 4:
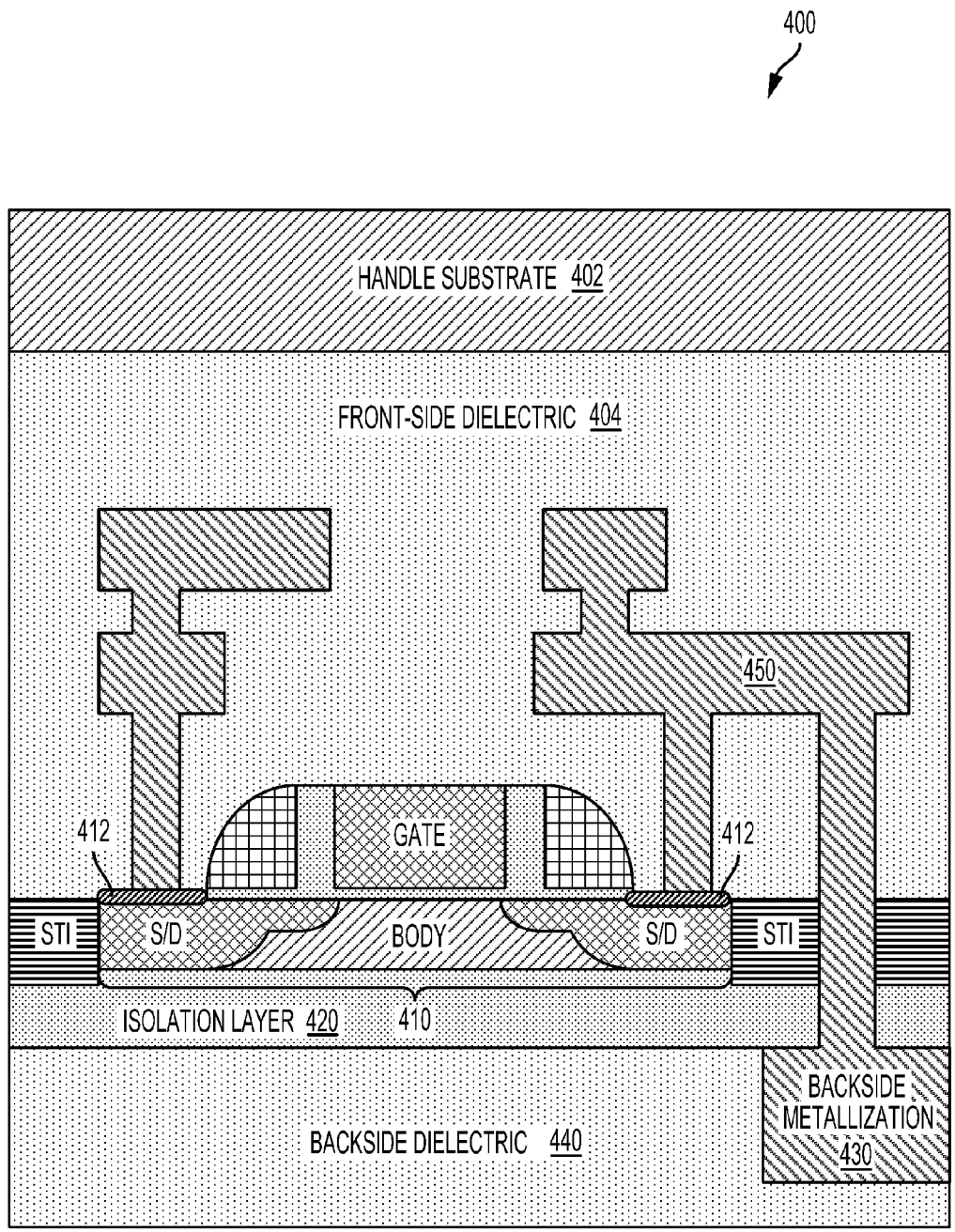
FIG. 4 is a cross-sectional view of an integrated radio frequency (RF) circuit structure fabricated using a layer transfer process according to aspects of the present disclosure.

FIG. 4 is a cross-sectional view of an integrated radio frequency (RF) circuit structure 400 fabricated using a layer transfer process according to aspects of the present disclosure. Representatively, the integrated RF circuit structure 400 includes an active device 410 having a gate, a body, and source/drain regions formed on an isolation layer 420. In silicon on insulator (SOI) implementations, the isolation layer 420 is a buried oxide (BOX) layer, and the body and source/drain regions are formed from an SOI layer including shallow trench isolation (STI) regions supported by the BOX layer.

The integrated RF circuit structure 400 also includes middle-end-of-line (MEOL)/back-end-of-line (BEOL) interconnects coupled to the source/drain regions of the active device 410. As described, the MEOL/BEOL layers are referred to as front-side layers. By contrast, the layers supporting the isolation layer 420 may be referred to as backside layers. According to this nomenclature, a front-side interconnect 450 is coupled to the source/drain regions of the active device 410 through front-side contacts 412 in a front-side dielectric layer 404. In addition, a handle substrate 402 is coupled to the front-side dielectric layer 404. In this configuration, a backside dielectric layer 440 is adjacent to and possibly supports the isolation layer 420. In addition, a backside metallization 430 is coupled to the front-side interconnect 450.

As shown in FIG. 4, a layer transfer process increases separation between the active device 410 and the handle substrate 402 to improve the harmonics of the integrated RF circuit structure 400. Various aspects of the disclosure provide techniques for layer transfer and post transfer metallization to provide access to a backside of devices of an integrated radio frequency (RF) integrated structure. By contrast, access to devices, formed during a front-end-of-line (FEOL) process, is conventionally provided during a middle-of-line (MOL) processing that provides contacts between the gates and source/drain regions of the devices and back-end-of-line (BEOL) interconnect layers (e.g., M1, M2, etc.). Aspects of the present disclosure involve a layer transfer process for forming dual sided silicidation contacts for high quality (Q)-factor RF applications.

Figure 5A:
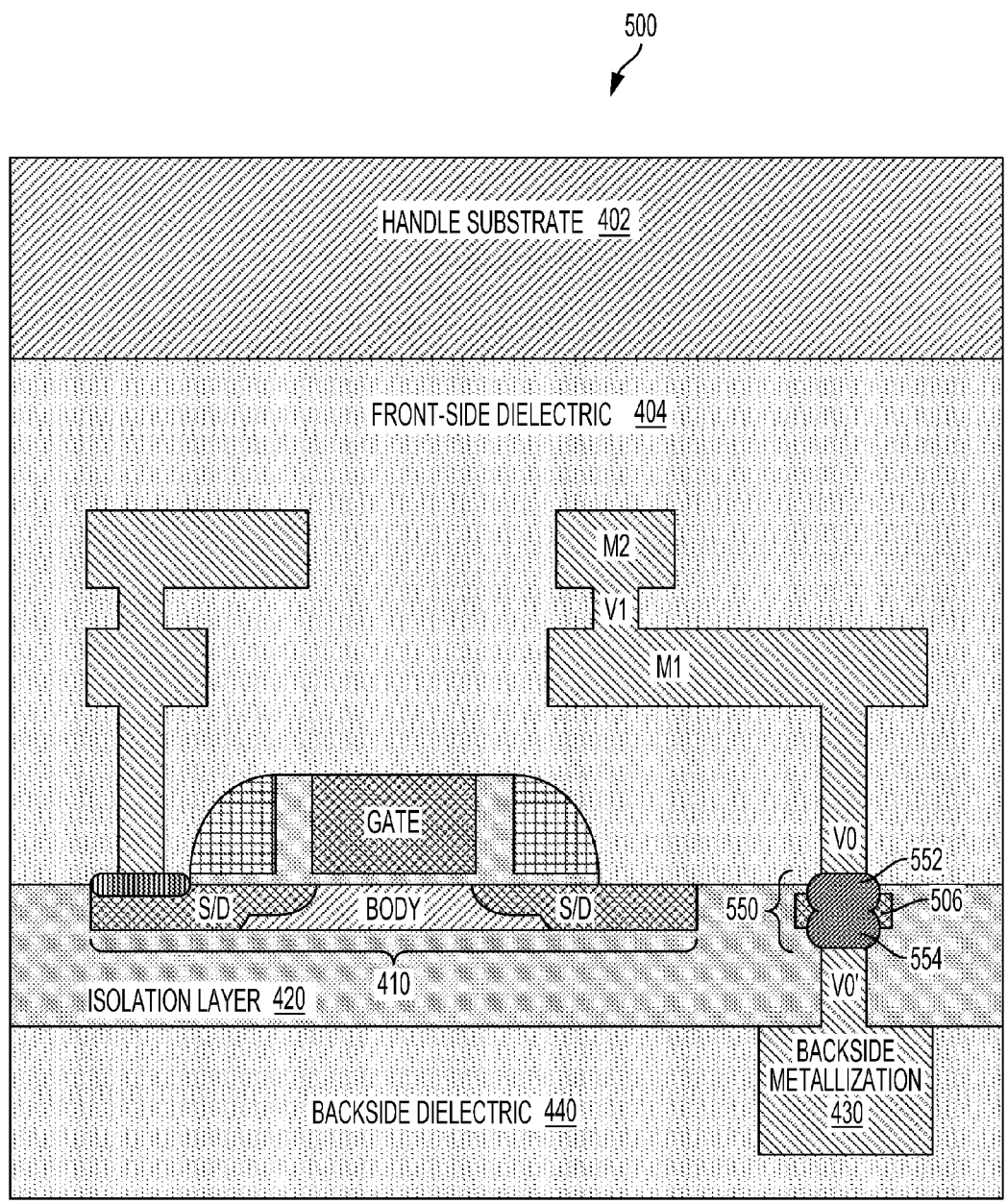
FIG. 5A is a cross-sectional view of an integrated circuit (IC) structure including a dual sided silicidation contact fabricated using a layer transfer process according to aspects of the present disclosure.

FIG. 5A is a cross-sectional view of an integrated RF circuit structure 500 (e.g., an integrated circuit (IC) device) including a dual sided silicidation contact 550 fabricated using a layer transfer process according to aspects of the present disclosure. As will be recognized, a configuration of the integrated RF circuit structure 500 is similar to the configuration of the integrated RF circuit structure 400 of FIG. 4. In the configuration shown in FIG. 5A, however, a dual sided silicidation contact 550 is provided that includes a front-side silicide 552 coupled to a backside silicide 554. The front-side silicide 552 may be deposited on a front-side of a diffusion region 506 (e.g., a silicon on insulator (SOI) region). The backside silicide 554 may be deposited on a backside of the diffusion region 506. The front-side silicide 552 and the backside silicide 554 may be silicon (Si) alloys.

In an exemplary aspect, the front-side silicide 552 merges with the backside silicide 554 through the diffusion region 506 to create the dual sided silicidation contact 550. As such, the dual sided silicidation contact 550 may be used as an ohmic contact between backside elements (e.g., the backside metallization 430, and backside contacts of transistors, capacitors, diodes, etc.) and front-side elements (e.g., the front-side metallization layers M1 and M2, and front-side contacts of transistors, capacitors, diodes, etc.) without etching through a substrate layer (e.g., silicon). The dual sided silicidation contact 550 thus directly couples the front-side metallization layers M1 and M2 to the backside metallization 430. In related aspects, the diffusion region 506 is thin enough to allow the front-side silicide 552 to merge with the backside silicide 554. For example, the depth of the diffusion region 506 is less than or equal to a diffusion depth of a layer of silicide that diffuses into the diffusion region 506.

The first front-side metallization layer M1 (e.g., a back-end-of-line interconnect layer M1) may be coupled to the front-side silicide 552 through a first front-side via V0. The first front-side metallization layer M1 may further be coupled to the second front-side metallization layer M2 through a second front-side via V1. The backside metallization 430 may be coupled to the backside silicide 554 through a backside via V0'. The diffusion region 506 and the backside via V0' may be formed in the isolation layer 420 (e.g., a buried oxide (BOX) layer).

The front-side via V0 and the backside via V0' may be distal and opposite from each other. Additionally, the front-side via V0 and the backside via V0' may be offset from each other. For example, the front-side silicide 552 and/or the backside silicide 554 may be silicide layers that overlap with each other in the diffusion region 506. Thus, as long as the front-side via V0 and the backside via V0' couple to the front-side silicide 552 and the backside silicide 554, respectively, the front-side via V0 and the backside via V0' may be offset from each other. The front-side silicide 552 and the backside silicide 554 may be deposited on the front-side and backside of the diffusion region 506, respectively, through front-side silicidation and backside silicidation processes. Additionally, the backside silicidation may be deposited according to the layer transfer process.

In related aspects of the present disclosure, the front-side metallization M1 and M2 may be within a front-side dielectric layer 404. In addition, the backside metallization 430 may be a post layer transfer metallization layer within a backside dielectric layer 440. In this arrangement, the backside dielectric layer 440 is adjacent to and possibly supports the isolation layer 420. In addition, a handle substrate 402 may be coupled to the front-side dielectric layer 404. The handle substrate 402 may be composed of a semiconductor material, such as silicon.

According to aspects of the present disclosure, the handle substrate 402 may be composed of a semiconductor material, such as silicon. In this configuration, the handle substrate 402 may include at least one other active device. Alternatively, the handle substrate 402 may be a passive substrate to further improve harmonics by reducing parasitic capacitance. In this configuration, the handle substrate 402 may include at least one other passive device. As described herein, the term "passive substrate" may refer to a substrate of a diced wafer or panel, or may refer to the substrate of a wafer/panel that is not diced. In one configuration, the passive substrate is comprised of glass, air, quartz, sapphire, high-resistivity silicon, or other like passive material. The passive substrate may also be a coreless substrate.

As described herein, MOL/BEOL layers are referred to as front-side layers. By contrast, the layers supporting the isolation layer 420 may be referred to as backside layers. According to this nomenclature, the integrated RF circuit structure 500 includes front-side metallization M1 and M2, front-side vias V0 and V1, backside via V0', and backside metallization 430.

Advantages of the dual sided silicidation contact 550 include a reduction in processing steps because the front-side silicide 552 merges with the backside silicide 554, so that a through via is not used. For example, a masking step is no longer performed. Additionally, the front-side elements do not need to be directly aligned with the backside elements, which simplifies production. Another advantage is the metal contacts can be very narrow in relation to the silicide layers, while still creating an ohmic contact with the silicide layers.

It is not obvious to merge silicide as described herein because conventionally, silicide is viewed as a layer on a surface of an active diffusion region, so its depth is not a consideration. As a result, not only is it not obvious to use silicide on both a front-side and a backside of a substrate, but it is also not obvious that silicide on both a front-side and a backside of a substrate would merge to create an ohmic contact.

Figure 5B:
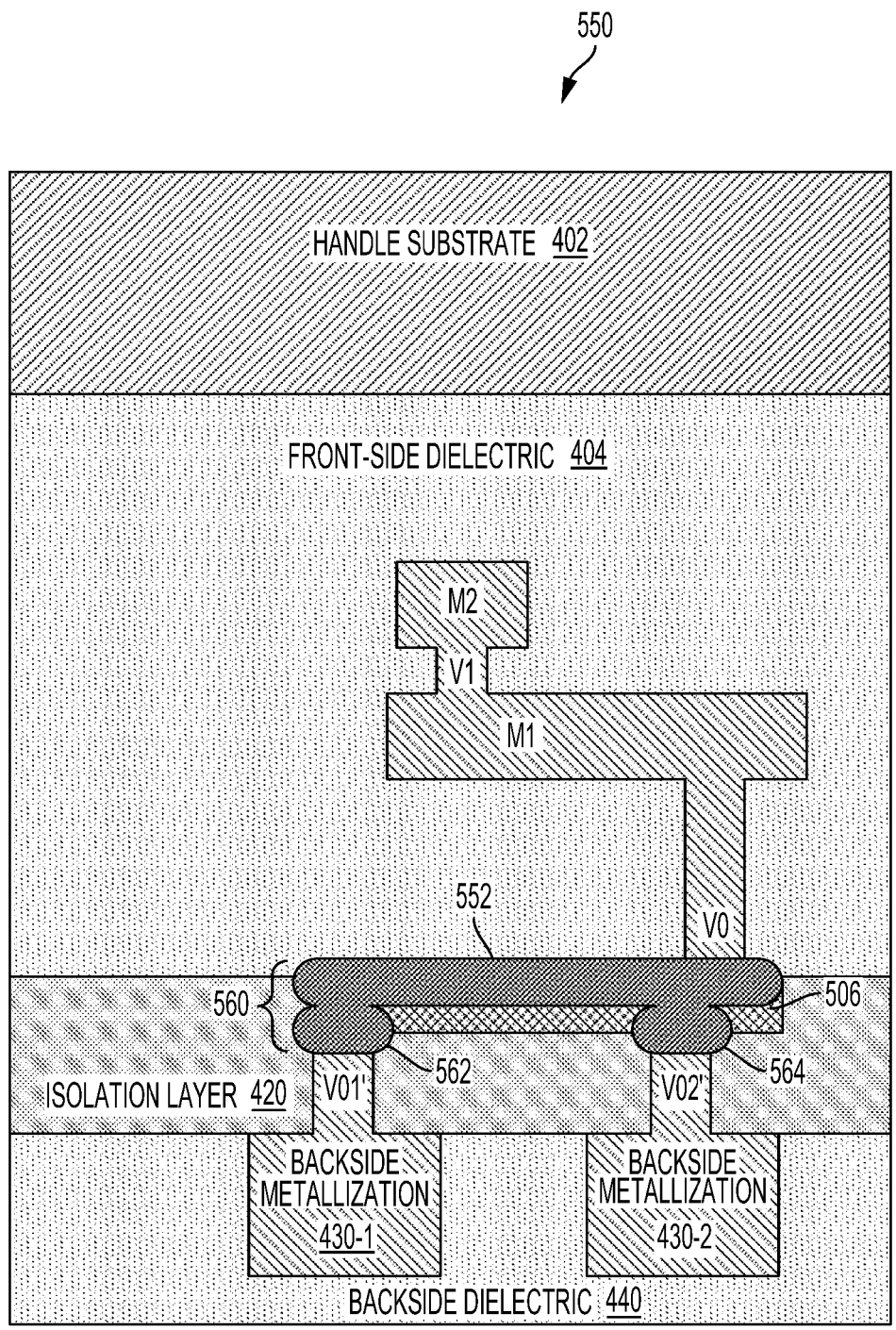
FIG. 5B is a cross-sectional view of an integrated circuit (IC) structure including a dual sided silicidation contact fabricated using a layer transfer process according to additional aspects of the present disclosure.

FIG. 5B is a cross-sectional view of an integrated circuit structure 570 including a dual sided silicidation contact 560 fabricated using a layer transfer process according to additional aspects of the present disclosure. As will be recognized, a configuration of the integrated circuit structure 570 is similar to the configuration of the integrated RF circuit structure 500 of FIG. 5A. In the configuration shown in FIG. 5B, however, a dual sided silicidation contact 560 is described. Representatively, the dual sided silicidation contact 560 includes a front-side silicide 552 coupled to a first backside silicide 562 (e.g., a first backside contact) and a second backside silicide 564 (e.g., a second backside contact). The front-side silicide 552 may be deposited on a front-side of a diffusion region 506 (e.g., a silicon on insulator (SOI) region). The first backside silicide 562 and the second backside silicide 564 may be deposited on a backside of the diffusion region 506. The front-side silicide 552 and the first backside silicide 562 and the second backside silicide 564 may also be silicon (Si) alloys.

As described above, the front-side silicide 552 merges with the first backside silicide 562 and the second backside silicide 564 through the diffusion region 506 to create the dual sided silicidation contact 560. As such, the dual sided silicidation contact 560 may also be used as an ohmic contact between multiple backside elements (e.g., the backside metallization 430 (430-1 and 430-2), and backside contacts of transistors, capacitors, diodes, etc.) and at least one front-side element (e.g., the front-side metallization layers M1 and M2, and front-side contacts of transistors, capacitors, diodes, etc.) without etching through a substrate layer (e.g., silicon). The dual sided silicidation contact 560 couples the front side metallization layers M1 and M2 to a first portion of backside metallization 430-1 and a second portion of the backside metallization 430-2. In related aspects, the diffusion region 506 is thin enough to allow the front-side silicide 552 to merge with the first backside silicide 562 and the second backside silicide 564. For example, the depth of the diffusion region 506 is less than or equal to a diffusion depth of a layer of silicide that diffuses into the diffusion region 506.

As disclosed, two or more backside elements may be coupled to at least one front-side element, as well as two or more front-side elements may be directly coupled to at least one backside element. This way, a single contact from one side can contact multiple contacts on the other side.

According to an aspect of the present disclosure, the front-side silicide 552 is a silicidation layer that covers the entire front-side of the diffusion region 506. The first backside silicide 562 and the second backside silicide 564 may be shorter in length and/or width than the front-side silicide 552, and are deposited apart from each other such that two ohmic contact points are formed without etching through the isolation layer 420 (e.g., buried oxide (BOX) layer). Alternatively, multiple backside silicides can create multiple ohmic contacts with the front-side silicide 552, for coupling multiple backside elements with a front-side element. Additionally, the backside contact may cover the entire backside of the diffusion region 506. As such, two or more front-side contacts may create two or more ohmic contacts for directly coupling a backside element with two or more front-side elements.

The first front-side metallization layer M1 may be coupled to the front-side silicide 552 through a first front-side via V0. The first front-side metallization layer M1 may further be coupled to a second front-side metallization layer M2 through a second front-side via V1. The first portion of backside metallization 430-1 (e.g., a first backside metallization) may be coupled to the first backside silicide 562 through a first backside via $V0_1'$. Additionally, the second portion of backside metallization 430-2 (e.g., a second backside metallization) may be coupled to the second backside silicide 564 through a second backside via $V0_2'$. The first backside via $V0_1'$ may be on a same layer as the second backside via $V0_2'$. The diffusion region 506 and the first and second backside vias $V0_1'$, $V0_2'$ may be formed in the isolation layer 420.

The front-side via V0 and the backside vias $V0_1'$ and $V0_2'$ may be distal and opposite from each other. Additionally, the front-side via V0 and the backside vias $V0_1'$ and $V0_2'$ may be offset from each other. For example, the front-side silicide 552 and/or the first backside silicide 562 and the second backside silicide 564 may be silicide layers that overlap with each other in the diffusion region 506. Thus, as long as the front-side via V0 and the backside vias $V0_1'$ and $V0_2'$ couple to the front-side silicide 552 and the first backside silicide 562 and the second backside silicide 564, respectively, the front-side via V0 and the backside vias $V0_1'$ and $V0_2'$ may be offset from each other. The front-side silicide 552 and the first backside silicide 562 and the second backside silicide 564 may be deposited on the front-side and backside of the diffusion region 506, respectively, through front-side silicidation and backside silicidation. Additionally, the backside silicidation may be deposited according to the layer transfer process.

In related aspects of the present disclosure, the front-side metallization M1 and M2 may be within the front-side dielectric layer 404. In addition, the backside metallization 430 may be post layer transfer metallization layers within a backside dielectric layer 440. The backside metallization 430 may be on a same metallization layer or different metallization layers. In this arrangement, the backside dielectric layer 440 is adjacent to and possibly supports the isolation layer 420. In addition, a handle substrate 402 may be coupled to the front-side dielectric layer 404. The handle substrate 402 may be composed of a semiconductor material, such as silicon.

Representatively, the integrated RF circuit structures (e.g., 500 and 570) may also include passive devices (e.g., a diodes, capacitors, inductors, etc.) that may use the dual sided silicidation contacts (e.g., 550 and/or 560) according to the disclosure.

Advantages of the dual sided silicidation contact 560 include a reduction in processing steps because the front-side silicide 552 merges with the first backside silicide 562 and the second backside silicide 564, so that through vias are not used. For example, a masking step is no longer performed. Additionally, the front-side elements do not need to be directly aligned with the backside elements, which simplifies production. Another advantage is the metal contacts can be very narrow in relation to the silicide layers, while still creating an ohmic contact with the silicide layers.

Figure 6:
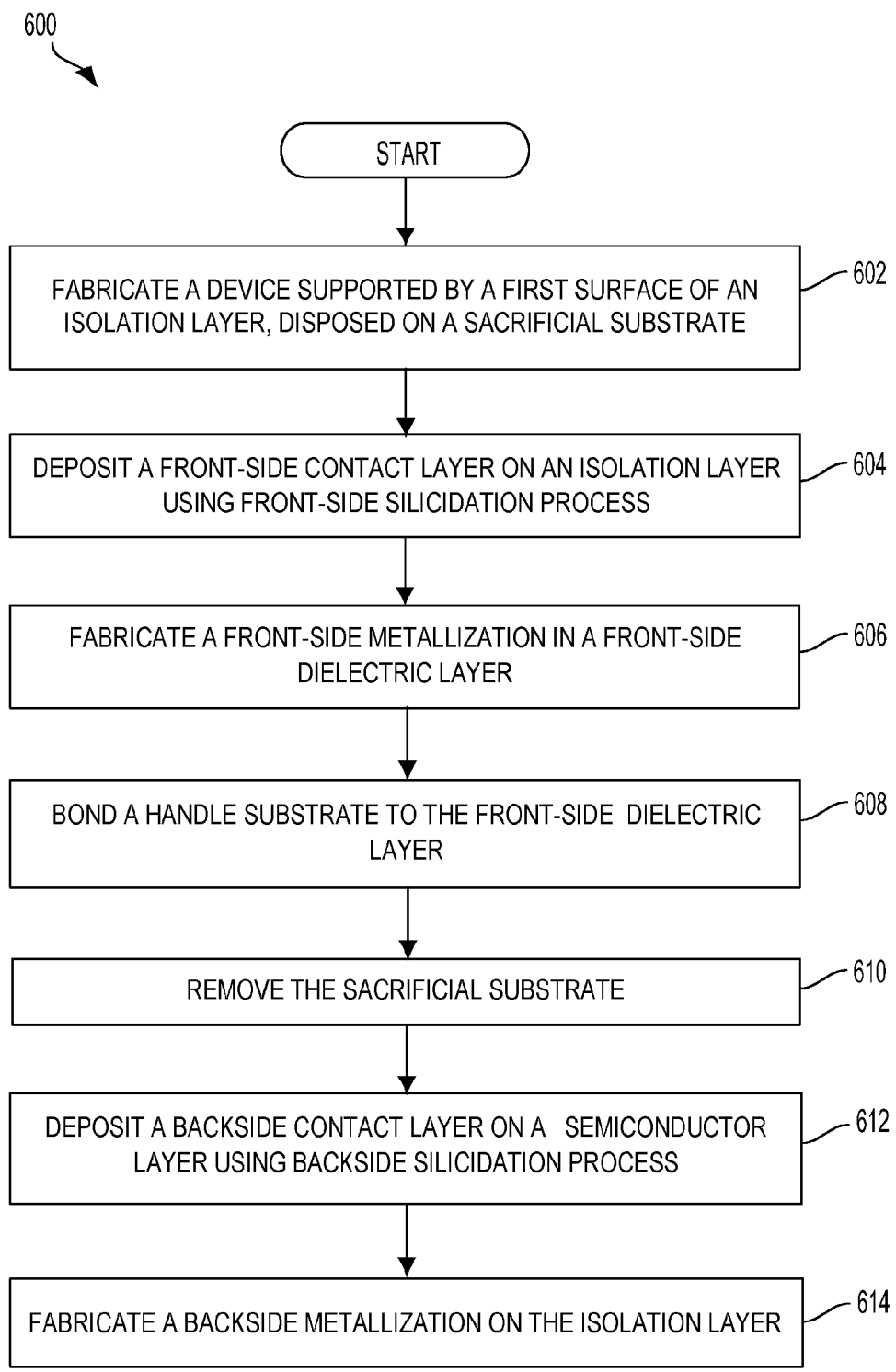
FIG. 6 is a process flow diagram illustrating a method of constructing an integrated circuit (IC) structure including a dual sided silicidation contact according to aspects of the present disclosure.

FIG. 6 is a process flow diagram illustrating a method 600 of constructing an integrated circuit (IC) structure including a dual sided silicidation contact according to aspects of the present disclosure. In block 602, a device (e.g., a transistor, capacitor, diode, metallization layer, etc.) is fabricated on a first surface of an isolation layer (e.g., diffusion region 506) on a sacrificial substrate. For example, as shown in FIG. 3A, an active device 310 is fabricated on a buried oxide (BOX) layer 320.

In block 604, a front-side contact layer is deposited on the isolation layer. For example, a front-side silicidation process is performed to deposit a front-side contact layer composed of silicide on a surface of the isolation layer. As shown in FIGS. 5A and 5B, the front-side contact layer (e.g., front-side silicide 552) may be deposited on a front-side of the isolation layer.

In block 606, a front-side metallization is fabricated in a front-side dielectric layer on the device and coupled to the front-side contact layer. For example, as shown in FIGS. 5A and 5B, the front-side metallization M1 is fabricated in the front-side dielectric layer 404 and is coupled to the front-side contact layer (e.g., front-side dielectric layer 404). During fabrication of the front-side metallization M1, the front-side dielectric layer 404 is patterned and etched to expose a predetermined portion of the diffusion region 506 (e.g., the isolation layer). Once exposed, the front-side contact layer is deposited on the exposed, predetermined portion of the diffusion region 506. Next, a second front-side metallization (e.g., second front-side metallization M2) is fabricated in the front-side dielectric layer 404.

According to an aspect, fabricating the front-side metallization includes patterning the front-side dielectric layer to expose predetermined portions of the front-side contact layer. Fabricating also includes depositing a first front-side metallization material within the patterned front-side dielectric layer and on the exposed predetermined portions of the front-side contact layer to form at least one front-side metallization plug. Additionally, a second front-side metallization material is deposited on the at least one metallization plug to form the front-side metallization.

In block 608, a handle substrate is bonded to the front-side dielectric layer on the device. For example, as shown in FIG. 3B, the handle substrate 302 is bonded to the front-side dielectric layer 306. A trap rich layer may be deposited on the front-side dielectric layer, and the handle substrate may be bonded to the trap rich layer.

In block 610, the sacrificial substrate is removed. As shown in FIG. 3B, the layer-transfer process includes removal of the sacrificial substrate 301.

In block 612, a backside contact layer is deposited on a semiconductor layer of the device such that the backside contact layer is in contact with the front-side contact layer. For example, the semiconductor layer is patterned to expose predetermined portions of the isolation layer, and silicide is deposited within the patterned semiconductor layer and on the exposed predetermined portions of the isolation layer to form the backside contact layer. Backside silicidation may be used for depositing at least one backside contact layer on a backside of the isolation layer. For example, as shown in FIG. 5B, the first backside silicide 562 and the second backside silicide 564 are deposited on the diffusion region 506.

In block 614, a backside metallization is fabricated in a backside dielectric layer supporting the isolation layer, the backside metallization coupled to the backside contact layer distally from the front-side metallization. As shown in FIG. 5B, the backside metallization 430 is fabricated on the backside dielectric layer 440. The backside metallization 430 may be coupled to the at least one backside silicide (e.g., 554, 562 and/or 564) through backside vias (e.g., vias $V0_1'$ and $V0_2'$). For example, during fabrication of the backside metallization 430, the isolation layer 420 (e.g., the semiconductor layer) is patterned and etched to expose predetermined portions of the backside contact. Once exposed, a first backside metallization material is deposited on the exposed predetermined portions of the backside contact to form at least one backside metallization plug (e.g., backside vias $V0_1'$ and $V0_2'$). Next, a second backside metallization material (e.g., the backside metallization 430) is deposited on the at least one backside metallization plug. The backside metallization may be distal and directly opposite to the front-side metallization. Additionally, the backside dielectric layer may be deposited on the semiconductor layer and the backside metallization.

According to a further aspect of the present disclosure, integrated RF circuitry, including a dual sided silicidation contact, is described. The integrated RF circuit includes first means for directly coupling a backside metallization to a front-side contact and second means for directly coupling a second backside metallization to the front-side contact. The integrated RF circuit also includes a front-side metal and a backside metal. The dual sided means may be the dual sided silicidation contact 550, or the dual sided silicidation contact 560, shown in FIGS. 5A and 5B. In another aspect, the aforementioned means may be any module or any apparatus configured to perform the functions recited by the aforementioned means.

Conventional complementary metal oxide semiconductor (CMOS) technology begins with a front-end-of-line (FEOL), in which a first set of process steps are performed for fabricating active devices (e.g., negative MOS (NMOS) or positive MOS (PMOS) transistors) on a substrate (e.g., a silicon on insulator (SOI) substrate). Next, is the middle-of-line (MOL), which is a set of process steps that connect the active devices to the back-end-of-line (BEOL) interconnects (e.g., M1, M2, M3, M4, etc.) using MOL contacts. Unfortunately, parasitic capacitance in the form of contact/interconnect to gate capacitance is caused by proximity of the BEOL interconnects/MOL contacts and the transistor gates. This additional capacitance causes adverse effects, such as circuit delays and loses.

Aspects of the disclosure are directed to using a dual sided silicidation contact that merges silicide on both sides of a substrate to form a low resistance contact instead of going through the substrate (e.g., silicon). For example, a front-side contact (e.g., front-side silicide) can be coupled to a first-side metallization and a backside contact (e.g., backside silicide) can be coupled to a backside metallization. The front-side contact is directly coupled to the backside contact. A layer transfer process may be used to fabricate the dual sided silicidation contact. Advantages include simplification in the fabrication process for backside contacts that saves at least one photo and etch step, both sides of the metal and contact align with each other to reduce the metal width, and a single contact from one side can contact multiple contacts on the other side.

Figure 7:
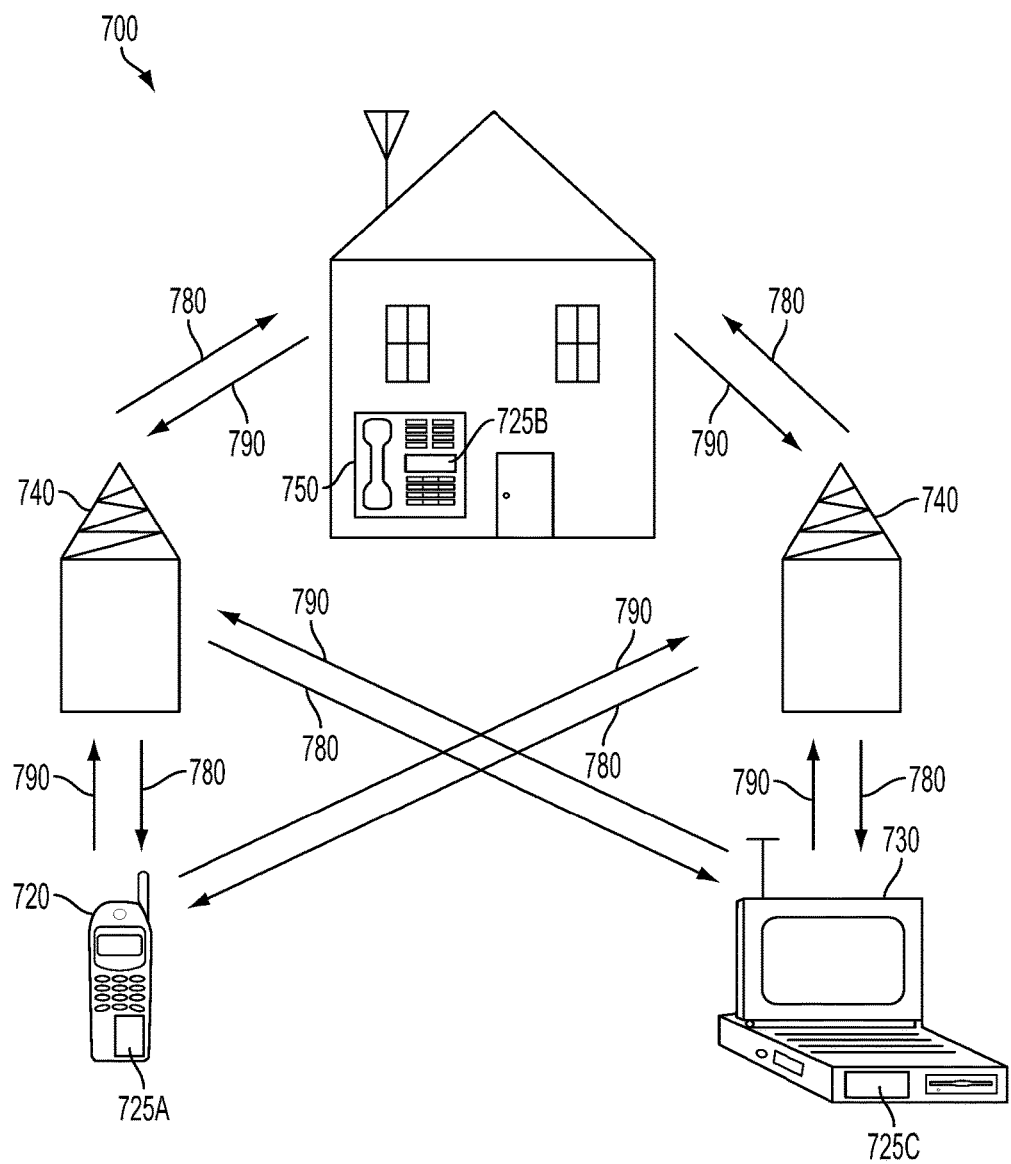
FIG. 7 is a block diagram showing an exemplary wireless communication system in which a configuration of the disclosure may be advantageously employed.

FIG. 7 is a block diagram showing an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include integrated circuit (IC) devices 725A, 725C, and 725B that may use the disclosed dual sided silicidation contact. It will be recognized that other devices may also use the disclosed, dual sided silicidation contact, such as the base stations, switching devices, and network equipment. FIG. 7 shows forward link signals 780 from the base station 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 7 illustrates remote units according to the aspects of the disclosure, the disclosure is not limited to these exemplary illustrated units. Aspects of the disclosure may be suitably employed in many devices, which include the disclosed dual sided silicidation contact.

Figure 8:
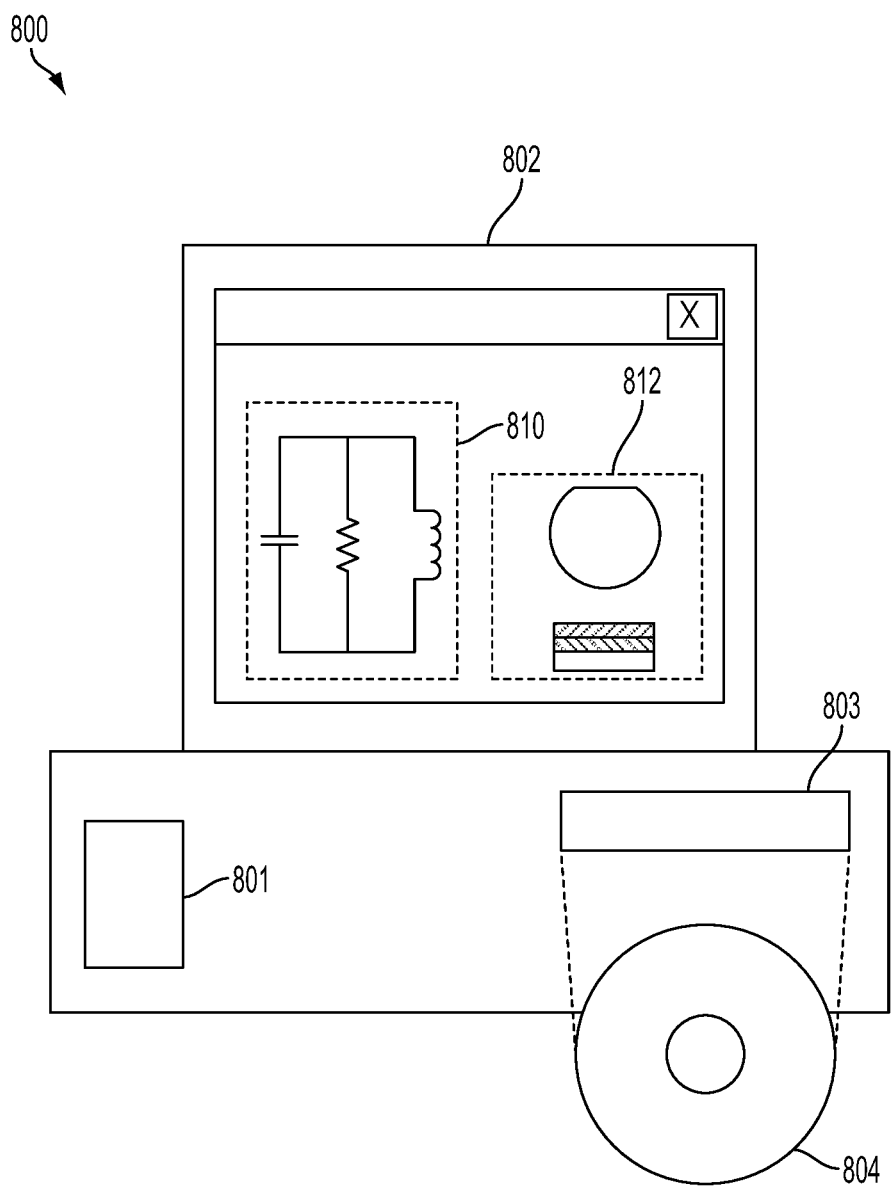
FIG. 8 is a block diagram illustrating a design workstation used for circuit, layout, and logic design of a semiconductor component according to one configuration.

FIG. 8 is a block diagram illustrating a design workstation used for circuit, layout, and logic design of a semiconductor component, which may use the dual sided silicidation contact disclosed above. A design workstation 800 includes a hard disk 801 containing operating system software, support files, and design software such as Cadence or OrCAD. The design workstation 800 also includes a display 802 to facilitate design of a circuit 810 or a semiconductor component 812 that use a dual sided silicidation contact. A storage medium 804 is provided for tangibly storing the circuit design 810 or the semiconductor component 812. The circuit design 810 or the semiconductor component 812 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit design 810 or the semiconductor component 812 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. An integrated circuit device, comprising:
   a front-side contact coupled to a front-side metallization; and
   a first backside contact coupled to a first backside metallization, the front-side contact directly contacting the first backside contact through a diffusion region.

2. The integrated circuit device of claim 1, in which the front-side contact is on a front-side of the diffusion region.

3. The integrated circuit device of claim 1, in which the first backside contact is on a backside of the diffusion region.

4. An integrated circuit device, comprising:
a front-side contact coupled to a front-side metallization;
a first backside contact coupled to a first backside metallization, the front-side contact directly coupling to the first backside contact; and a second backside contact coupled to a second backside metallization, the second backside contact directly coupling to the front-side contact.

5. An integrated circuit device, comprising:
a front-side contact coupled to a front-side metallization; and
a first backside contact coupled to a first backside metallization, the front-side contact directly coupling to the first backside contact in which the front-side contact comprises front-side silicide, and the first backside contact comprises backside silicide.

6. The integrated circuit device of claim 1, in which the front-side metallization and the first backside metallization are directly opposite from each other.

7. The integrated circuit device of claim 1, in which the front-side metallization and the first backside metallization are offset from each other.

8. The integrated circuit device of claim 1, integrated into an RF front end module, the RF front end module incorporated into at least one of a music player, a video player, an entertainment unit, a navigation device, a communications device, a personal digital assistant (PDA), a fixed location data unit, a mobile phone, and a portable computer.

9. An integrated circuit, comprising:
a front-side contact coupled to a front-side metallization; and
a first means for directly coupling a first backside metallization to the front-side contact, the first means directly contacting the front-side contact through a diffusion region.

10. The integrated circuit of claim 9, in which the first means comprises a backside contact on a backside of the diffusion region.

11. The integrated circuit of claim 9, in which the front-side contact is on a front-side of the diffusion region.

12. The integrated circuit of claim 9, further comprising a second means for directly coupling a second backside metallization to the front-side contact.

13. The integrated circuit of claim 12, in which the second means for directly coupling comprises a second backside contact on a backside of the diffusion region.

14. The integrated circuit of claim 9, integrated into an RF front end module, the RF front end module incorporated into at least one of a music player, a video player, an entertainment unit, a navigation device, a communications device, a personal digital assistant (PDA), a fixed location data unit, a mobile phone, and a portable computer.

* * * * *